US008155726B2

(12) United States Patent
Seki et al.

(10) Patent No.: US 8,155,726 B2
(45) Date of Patent: Apr. 10, 2012

(54) MAGNETIC DETECTION COIL AND APPARATUS FOR MAGNETIC FIELD MEASUREMENT

(75) Inventors: Yusuke Seki, Musashino (JP); Akihiko Kandori, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 456 days.

(21) Appl. No.: 12/277,692

(22) Filed: Nov. 25, 2008

(65) Prior Publication Data

US 2009/0143665 A1 Jun. 4, 2009

(30) Foreign Application Priority Data

Nov. 26, 2007 (JP) ................................ 2007-305082

(51) Int. Cl.
*A61B 5/05* (2006.01)

(52) U.S. Cl. ........ 600/409; 600/407; 600/410; 600/422; 324/248

(58) Field of Classification Search .................. 600/409, 600/422, 451; 324/244, 248, 258
See application file for complete search history.

(56) References Cited

U.S. PATENT DOCUMENTS 5,891,031 A * 4/1999 Ohyu ............................ 600/409
6,275,719 B1 * 8/2001 Kandori et al. ............... 600/409
6,462,540 B1 * 10/2002 Kandori et al. ............... 324/248
2007/0085534 A1 * 4/2007 Seki et al. ..................... 324/248

FOREIGN PATENT DOCUMENTS

JP 9-84777 3/1997
JP 2007-108083 4/2007

OTHER PUBLICATIONS

European Search Report in European Application No. 08020555.2-2216/2063281 dated Dec. 6, 2010.

* cited by examiner

*Primary Examiner* — Brian Casler
*Assistant Examiner* — Michael N Fisher
(74) *Attorney, Agent, or Firm* — Brundidge & Stanger, P.C.

(57) ABSTRACT

A magnetic detection coil made of a single wire is constructed of one of superconducting and metallic materials. Four second-order differential coils are arranged so that a geometric figure obtained by connecting the respective centers of the four differential coils can form a parallelogram. By providing intersections between the four second-order differential coils, the values of magnetic flux respectively penetrating the differential coils are differentiated in three different directions.

19 Claims, 11 Drawing Sheets

MAGNETIC DETECTION COIL AND APPARATUS FOR MAGNETIC FIELD MEASUREMENT

CROSS REFERENCE TO RELATED APPLICATIONS

The present application claims priority from Japanese patent application 2007-305082 filed on Nov. 26, 2007 the content of which is hereby incorporated by reference into this application.

BACKGROUND OF THE INVENTION

1. Field of the Invention

The present invention relates to a technology for a magnetic detection coil and an apparatus for magnetic field measurement.

2. Description of Related Art

An apparatus for biomagnetic field measurement, which is used for magnetocardiography and magnetoencephalography, has so far employed a technique that uses a magnetic detection coil made of a superconductor wire to detect magnetic signals generated by a living organism and to transmit them to a superconducting quantum interference device (hereinafter referred to as SQUID). A SQUID has a superconducting ring with Josephson junctions, in which a voltage across the Josephson junction cyclically varies with a period of $\Phi_0$=h/2e (Wb) according to magnetic flux penetrating the SQUID.

It has been a technique typically adopted in magnetocardiography and magnetoencephalography to use a magnetic detection coil made of a superconductor wire to detect magnetic signals generated by a measurement object as magnetic flux and transmit the detected magnetic flux to a SQUID. The magnetic detection coil functions to eliminate noise caused by environmental magnetic fields so as to increase the Signal-to-Noise (S/N) ratio.

FIG. 9 is a schematic diagram illustrating a composition of a Flux Locked Loop (FLL) circuit in a typical apparatus for magnetic field measurement.

In the FLL circuit 1300, a current produced by magnetic flux penetrating a magnetic detection coil 1301 flows through both a magnetic detection coil 1301 and an input coil 1302. Accordingly, the input coil 1302 generates magnetic flux, which is then transmitted to a SQUID 1303. The SQUID 1303 has a superconducting ring with Josephson junctions. A bias current source 1305 supplies a bias current to the SQUID 1303. A voltage across the SQUID 1303 cyclically varies with a period of $\Phi_0$=h/2e (Wb), according to magnetic flux penetrating the SQUID 1303. The FLL circuit 1300 has a feedback circuit as well, which is constituted by a pre-amplifier 1306, an integrator 1307, a feedback resistor 1308 and a feedback coil 1304. This feedback circuit follows the SQUID 1303 in the FLL circuit 1300. The feedback coil 1304 feeds back magnetic flux so as to negate any change in magnetic flux penetrating the SQUID 1303.

It is possible to obtain the current value for the current flowing through the feedback coil 1304 by measuring a potential difference across the feedback resistor 1308. The magnetic flux penetrating the SQUID 1303 can be calculated based on this obtained current value.

A circuit which has the composition described above is called an FLL circuit. The FLL circuit 1300 can provide an output voltage proportional to a magnetic field detected with the magnetic detection coil 1301.

The following description is given of a typical magnetic detection coil used for an apparatus for biomagnetic field measurement, while referring to FIG. 10.

FIG. 10 illustrates schematic diagrams for typical magnetic detection coils used for an apparatus for biomagnetic field measurement. FIG. 10A shows a zeroth-order differential coil (magnetometer). FIG. 10B shows a first-order differential coil, FIG. 10C shows a second-order differential coil. FIG. 10D shows a zeroth-order differential coil formed on a thin film substrate. FIG. 10E shows a first-order differential coil formed on a thin film substrate.

As shown in these drawings, a magnetic detection coil typically employs an arrangement where a superconductor wire is wound around a cylindrical bobbin or another arrangement where thin films are formed on a substrate.

As shown in FIG. 10A, a zeroth-order differential magnetic detection coil 181 has a coil 181*a* which is made of a superconductor wire wound one turn around a bobbin 1811. Magnetic flux $\Phi_M$ detected by the zeroth-order differential magnetic detection coil 181 is represented by the following equation (1):

$$\Phi_M=\Phi_{181a} \qquad (1)$$

where $\Phi_{181a}$ represents magnetic flux penetrating the coil 181*a*.

Because the magnetic flux $\Phi_M$ is equal to the magnetic flux $\Phi_{181a}$ which penetrates the coil 181*a*, the zeroth-order differential magnetic detection coil 181 functions to yield magnetic signals greater than any of the first-order and the second-order differential magnetic detection coils to be described later. However, the zeroth-order differential magnetic detection coil does not have a function of decreasing an effect of the environmental magnetic field at all. Therefore the zeroth-order differential magnetic detection coil 181 outputs a signal which is directly affected by a noise caused by the environmental magnetic field. Accordingly, the zeroth-order differential magnetic detection coil 181 is usually used in a magnetically shielded room.

In this specification, a distance between centers of coils is referred to as "center-to-center distance".

Given the magnetic flux $\Phi_M$ shown in FIG. 10A provides a positive magnetic signal, the zeroth-order differential magnetic detection coil 181 generates a current flowing in the direction indicated by an arrow along the coil as shown in the same drawing. Hereinafter, a magnetic signal corresponds to magnetic flux pointing upward, as shown in FIG. 10A, is defined as a positive magnetic signal. The direction, in which the current flows through a magnetic detection coil for a positive magnetic signal to be detected, is represented by an arrow.

As shown in FIG. 10B, a first-order differential magnetic detection coil 182 comprises coils 182*a* and 182*b*. The coil 182*a* is made of a superconductor wire wound one turn around a bobbin 1821 in the "first winding direction." The coil 182*b* also is made of a superconductor wire wound one turn around the bobbin 1821 in the "second winding direction" which is defined as an opposite winding direction to the "first winding direction", and disposed a predetermined distance "vertically" (as described later) apart from the coil 182*a*. With the composition described above, magnetic flux $\Phi_{G1}$ detected by the first-order differential magnetic detection coil 182 is represented by the following equation (2):

$$\Phi_{G1}=\Phi_{182a}-\Phi_{182b} \qquad (2)$$

where $\Phi_{182a}$ gives magnetic flux which penetrates the coil 182*a*, and $\Phi_{182b}$ gives magnetic flux which penetrates the coil 182*b*.

The reason why magnetic flux $\Phi_{182b}$ is subtracted from $\Phi_{182a}$ is that the coil 182*b* is wound in the opposite winding direction.

Taking a difference in magnetic field as described above with the equation (2) is referred to as "differentiating" in this specification. For example, "taking a difference once" is referred to as "first-order differentiating", and "taking a difference twice" is referred to as "second-order differentiating".

The coil 182*a* is positioned in the vicinity of a test object in order to detect a magnetic field, while the coil 182*b* is positioned relatively far away from the test object. As a result, the effect of the environmental magnetic field which is uniformly distributed in the space is negated, and the magnetic flux only attributed to the test object can be detected.

It should also be noted that a "vertical" direction is referred to as a direction perpendicular to the loop plane and that a "horizontal" direction is referred to as a direction in parallel with the loop plane. Accordingly, it may be possible to have the vertical direction coincide with the direction of magnetic field measurement.

As shown in FIG. 10C, a second-order differential magnetic detection coil 183 comprises coils 183*a*, 183*b* and 183*c*. The coil 183*a* is made of a superconductor wire wound one turn around a bobbin 1831 in the first winding direction. The coil 183*b* is made of a superconductor wire wound two turns around the bobbin 1831 in the second winding direction, which is opposite to the first winding direction, and disposed a predetermined distance vertically apart from the coil 183*a*. The coil 183*c* is made of a superconductor wire wound one turn around the bobbin 1831 in the first winding direction, and disposed the predetermined distance vertically apart from coil 183*b*. Magnetic flux $\Phi_{G2}$ detected by the second-order differential magnetic detection coil 183 is represented by the following equation (3):

$$\Phi_{G2}=\Phi_{183a}-2\Phi_{183b}+\Phi_{183c} \quad (3)$$

where $\Phi_{183a}$ gives magnetic flux which penetrates the coil 183*a*, $\Phi_{183b}$ gives magnetic flux which penetrates the coil 183*b*, and $\Phi_{183c}$ gives magnetic flux which penetrates the coil 183*c*.

As described above, by taking two steps to differentiate magnetic flux with respect to the vertical direction, the second-order differential magnetic detection coil 183 is capable of reducing an effect of the environmental magnetic field distributed with a first-order gradient as well as an effect of the environmental magnetic field distributed uniformly in the space. As a result, the second-order differential magnetic detection coil 183 is capable of reducing the effect of environmental magnetic field more efficiently than the first-order differential magnetic detection coil 182, which is only capable of reducing the effect of environmental magnetic field distributed uniformly in the space. However, if magnetic signals are included in magnetic flux $\Phi_{183b}$ penetrating the coil 183*b* and magnetic flux $\Phi_{183c}$ penetrating the coil 183*c*, the second-order differential magnetic detection coil 183 results in a lowered magnetic signal being detected.

There is a technique for forming a magnetic detection coil by using superconductor thin films, instead of a superconductor wire. FIG. 10D illustrates a zeroth-order differential magnetic detection coil 184 constituted by superconductor thin films formed on a substrate 1841. Magnetic flux $\Phi_{184a}$ detected by a coil 184*a* is transmitted to a SQUID 1842 formed on the same substrate 1841. Similarly, FIG. 10E illustrates a first-order differential magnetic detection coil 185 constituted by coils 185*a* and 185*b* formed on a substrate 1851, which have winding directions opposite to each other. A magnetic flux difference $\Phi_{185a}-\Phi_{185b}$ between magnetic flux $\Phi_{185a}$ detected by the coil 185*a* and magnetic flux $\Phi_{185b}$ detected by the coil 185*b* is transmitted to a SQUID 1852 formed on the same substrate 1851. An advantage of using superconducting thin films is that it is possible to fabricate a magnetic detection coil having an accurate magnetic detection coil area as specified.

Based on characteristic features of differential coils described above, several types of arrangements for magnetic detection coils have so far been proposed. As an example of such arrangements, a technique has been proposed as stated in Japanese laid-open patent application 09-084777; wherein plural types of magnetic detection coils having different differential orders were placed at the same measurement point so as to calculate and estimate a magnetic field source and/or a magnetic field source distribution within a living organism.

FIG. 11 gives a perspective view of a magnetic detection coil as specified by Japanese laid-open patent application 2007-108083.

It has proposed a magnetic detection coil, e.g. a coil 200 as shown in FIG. 11, which differentiates gradients in the magnetic field in two different directions. The magnetic detection coil 200 in FIG. 11 comprises second-order differential coils 201*a* and 201*b* given by FIG. 10C which are arranged so as to take the difference along the x-axis direction.

However, since the conventional differential coil having a structure which makes it possible to detect magnetic field differentiated in a certain direction, as shown in FIG. 10, said arrangement has a problem if the effects of environmental magnetic fields are strong; for example, in the case of an environment without a magnetic shield, it is not possible to adequately reduce the effects of environmental magnetic fields. One possible technique for decreasing said effects is to increase the order of a differential magnetic detection coil. Although the effects of environmental magnetic fields can be decreased with the technique, magnetic signals to be detected may also be decreased.

As for a technique utilizing a magnetic detection coil formed on superconducting thin films, it has a problem of having a difficulty in fabricating a magnetic detection coil with a three-dimensional structure due to characteristic of the thin films.

It should be noted that there is a trade-off a trade-off between the differential order of the magnetic coils and the signal level from the magnetic coils. If the differential order of the magnetic coils is increased, the signal level from the magnetic coils lowers although the effect of the environmental magnetic field is decreased. Biomagnetic field measurements have so far been carried out usually with first-order differential magnetic detection coils, or second-order differential magnetic detection coils in a magnetically shielded room, depending on the magnitude of an environmental magnetic field.

In addition, since a type of a magnetic detection coil having a three-dimensional structure, as shown in FIGS. 10A to 10C, and a type of a magnetic detection coil formed on superconducting thin films, as shown in FIGS. 10D and 10E, are different from each other in terms of their usages, structures and methods for manufacturing, it appears to be unproductive to get an idea of combining these two types of coils.

According to Japanese laid-open patent application 2007-108083, it has become apparent that signal intensity can decrease according to the direction of a current as the signal source, though the stated technique can more efficiently decrease the effect of the environmental magnetic field than the technique described in Japanese laid-open patent application 09-084777. Namely, the following description continues while referring to FIG. 11; a magnetic detection coil according to Japanese laid-open patent application 2007-108083 gives good detection sensitivity when a current flows in parallel to the x-axis. However, the coil can significantly decrease detection sensitivity when a current flows in parallel to the y-axis, i.e. in the direction perpendicular to the line connecting the respective centers of second-order differential coils which form the magnetic detection coil 200. In addition, this type of a magnetic detection coil cannot sufficiently reduce the effects of environmental magnetic fields if the effects are large.

In short, conventional differential coils have a problem of inability to provide sufficient reduction of environmental magnetic fields if the effects of environmental magnetic fields are large; they also have a problem of causing a decrease in signal intensity while lowering the effects of environmental magnetic fields, depending on the direction of a current used as the signal source.

SUMMARY OF THE INVENTION

Taking the above-mentioned problems into account, the present invention has an objective to provide a magnetic detection coil which enables providing stable detection of a magnetic signal regardless of the current direction of a signal source.

In order to solve said problems, the present invention provides a magnetic detection coil made of a single wire of either a superconductor material or a metal material, comprising four differential coils being disposed such that four respective centers of the four differential coils constitute 4 apexes of a parallelogram, wherein said four differential coils are electrically connected so as to measure a difference in a magnetic flux value for magnetic flux penetrating the differential coil between a pair of the differential coil, with respect to each of three different directions. The present invention also provides an apparatus using said magnetic detection coils for magnetic field measurement.

The present invention can provide stable detection of a magnetic signal despite the direction of a current used as the signal source.

BRIEF DESCRIPTION OF THE DRAWINGS

FIG. 3 shows graphs illustrating distributions of signal intensity respectively detected by the coil 1*b*, the coil 183, and the coil 200 in the case of $\Phi=0$, in other words, when a current dipole Q exists at (250, 0, 0) (nA·m).

FIG. 10 shows schematic diagrams illustrating typical magnetic detection coils used for biomagnetic field measurement.

DESCRIPTION OF THE PREFERRED EMBODIMENT

Figure 1:
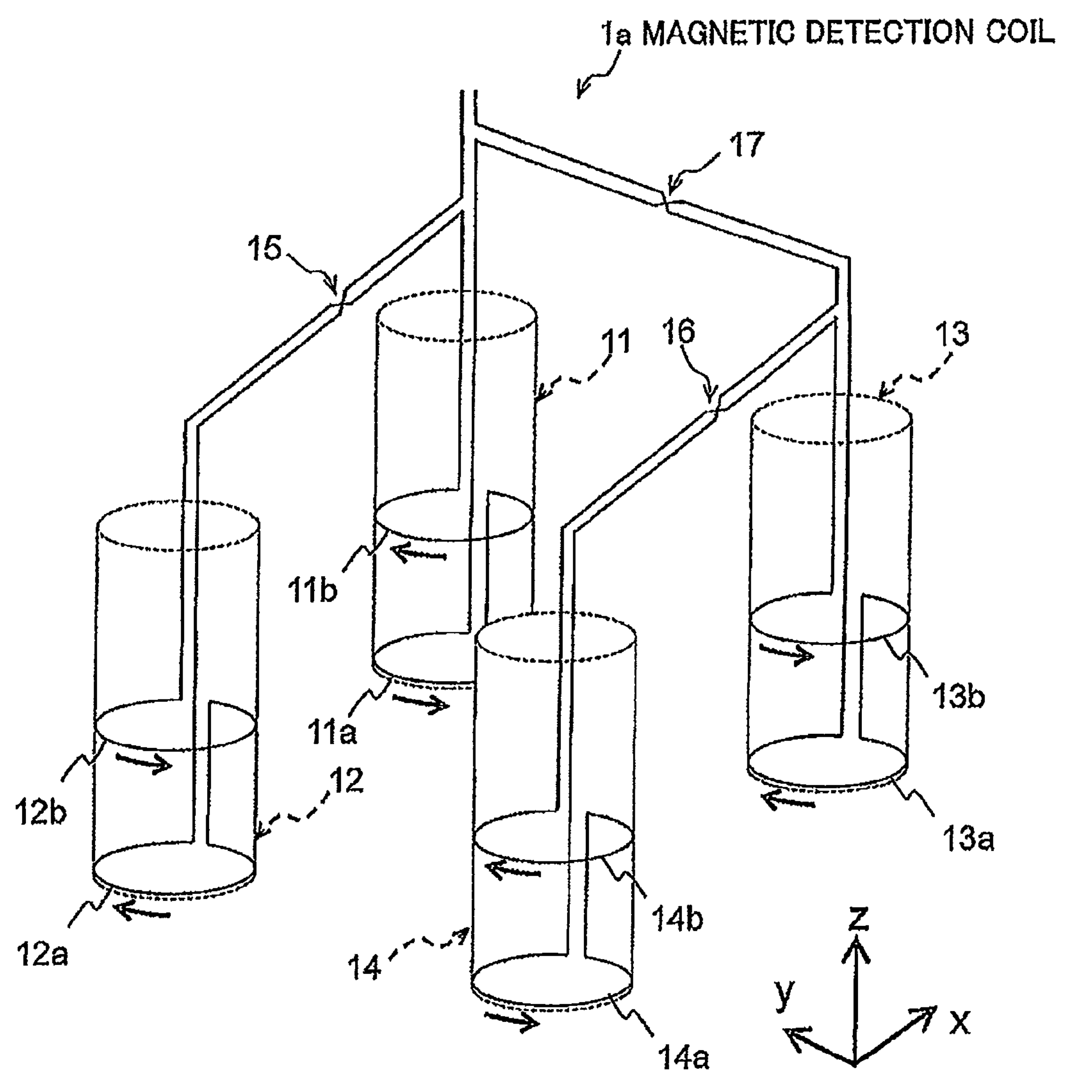
FIG. 1 is a perspective view illustrating a magnetic detection coil according to an embodiment (case 1 of the present invention).

The most preferred embodiments of the present invention (hereinafter called "embodiments") are in detail described with reference to the drawings. In the drawings referenced hereinafter, items having the same function are given the same reference number.

As for a superconductor material forming a magnetic detection coil 1 used in an apparatus described in the following embodiment, any of a low-temperature superconductor material and a high-temperature superconductor material may be used. A low-temperature superconductor material, which has a low superconducting transition temperature, works as a superconductor at relatively low temperatures (e.g. the temperature of liquid helium). In contrast, a high-temperature superconducting material, which has a high superconducting transition temperature, works as a superconductor at relatively high temperatures (e.g. the temperature of liquid nitrogen). It may be possible to alternatively adopt a superconducting material having a superconducting transition temperature between liquid helium temperature and liquid nitrogen temperature, or a superconducting material having a superconducting transition temperature higher than liquid nitrogen temperature. It is understood that materials having high electric conductivity such as copper can also be used as a material for the magnetic detection coil 1.

a. Magnetic Detection Coil: Embodiment 1

FIG. 1 is a perspective view illustrating a magnetic detection coil according to an embodiment.

A magnetic detection coil 1*a* in the embodiment includes first-order differential coils 11, 12, 13 and 14, which are formed from a single wire.

The first-order differential coil 11 (called first differential coil) comprises a coil 11*a* and a coil 11*b*. The coil 11*a* is made of a superconductor wire wound one turn in the first winding direction around a bobbin, and the coil 11*b* is made of a superconductor wire wound one turn in the second winding direction (which is opposite to the first winding direction) around the same bobbin, and disposed a predetermined distance in the positive direction of the z-axis apart from the coil 11*a*. Since winding directions of the coil 11*a* and the coil 11*b* are opposite to each other, a magnetic flux difference is measured and taken between the coil 11*a* and the coil 11*b* (referred to as "difference in the first direction").

The first-order differential coil 12 (called second differential coil) is disposed adjacent to the first-order differential coil 11, and comprises a coil 12*a* and a coil 12*b*. The coil 12*a* is made of a superconductor wire wound one turn in the second winding direction around a bobbin which is disposed a predetermined distance in the negative direction of the x-axis apart from the coil 11*a*. The coil 12*b* is made of a superconductor wire wound one turn in the first winding direction around the same bobbin, and disposed a predetermined in the positive direction of the z-axis distance apart from the coil 12*a*.

The first-order differential coil 13 (called third differential coil) is disposed adjacent to the first-order differential coil 11, and comprises a coil 13*a* and a coil 13*b*. The coil 13*a* is made of a superconductor wire wound one turn in the second winding direction around a bobbin which is disposed a predetermined distance in the negative direction of the y-axis spaced apart from the coil 11*a*. The coil 13*b* is made of a superconductor wire wound one turn in the first winding direction around the same bobbin, and disposed a predetermined distance in the positive direction of the z-axis apart from the coil 13*a*.

The first-order differential coil 14 (called fourth differential coil) is disposed adjacent to the first-order differential coil 13, and comprises a coil 14*a* and a coil 14*b*. The coil 14*a* is made of a superconductor wire wound one turn in the first winding direction around a bobbin which is disposed a predetermined distance in the negative direction of the x-axis spaced apart from the coil 13*a*. The coil 14*b* is made of a superconductor wire wound one turn in the second winding direction around the same bobbin, and disposed a predetermined distance in the positive direction of the z-axis apart from the coil 14*a*.

According to the same method as that employed for the first-order differential coil 11, each magnetic flux difference in the first direction is measured and taken by each of first-order differential coils 12, 13 and 14.

By crossing the single wire at an intersection 15 between the first-order coils 11 and 12, a magnetic flux difference is taken between the first-order coil 12 and the first-order coil 11 (referred to as "difference in the second direction"). Similarly, by crossing the single wire at an intersection 16 between the first-order coils 13 and 14, a magnetic flux difference is taken between the first-order coil 14 and the first-order coil 13 (referred to as "difference in the second direction").

Furthermore, by crossing the single wire at an intersection 17, a magnetic flux difference is taken between the difference in the second direction between first-order differential coils 13 and 14 and the difference in the second direction between the first-order differential coils 12 and 11 (referred to as "difference in the third direction").

The magnetic detection coil 1*a* is formed of the single wire, as already described above. In addition, all of coil 11*a*, coil 12*a*, coil 13*a*, and coil 14*a* are disposed on a plane while all of coil 11*b*, coil 12*b*, coil 13*b*, and coil 14*b* are also disposed on another plane. In other words, the respective pairs of four first-order differential coils are disposed in parallel with one another and spaced a predetermined distance apart from one another.

With the arrangement described above, magnetic flux $\Phi_{P1}$ detected by the magnetic detection coil 1*a* can be given by the following equation (4):

$$\Phi_{P1}=[(\Phi_{11a}-\Phi_{11b})-(\Phi_{12a}-\Phi_{12b})]-[(\Phi_{13a}-\Phi_{13b})-(\Phi_{14a}-\Phi_{14b})] \quad (4)$$

where $\Phi_{11a}$ and $\Phi_{11b}$ are magnetic flux penetrating the coils 11*a* and 11*b*, respectively; $\Phi_{12a}$ and $\Phi_{12b}$ are magnetic flux penetrating the coils 12*a* and 12*b*, respectively; $\Phi_{13a}$ and $\Phi_{13b}$ are magnetic flux penetrating the coils 13*a* and 13*b*, respectively; $\Phi_{14a}$ and $\Phi_{14b}$ are magnetic flux penetrating the coils 14*a* and 14*b*, respectively.

Figure 10A:
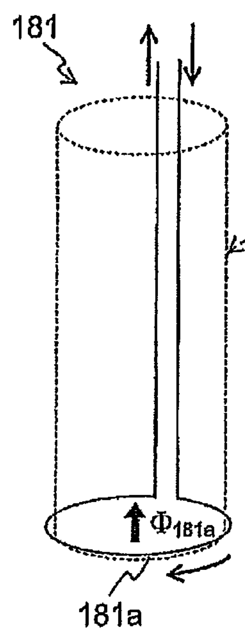
FIG. 10A is a zeroth-order differential coil (magnetometer).
Figure 10B:
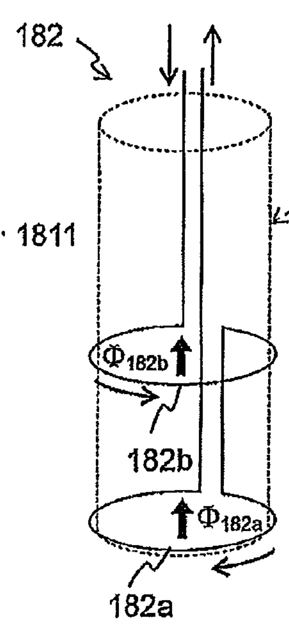
FIG. 10B is a first-order differential coil.

As described above, the magnetic detection coil 1*a* according to this embodiment is a magnetic detection coil which first-order differentiates the respective magnetic field in the z-axis direction ("difference in the first winding direction" given by a polynomial expression in the respective parentheses in the above equation). The respective magnetic field is then first-order differentiated in the x-axis direction ("difference in the second winding direction" given by a polynomial expression in the respective square brackets in the above equation); the respective magnetic field is finally first-order differentiated in the y-axis direction ("difference in the third direction" given by the entire expression of the above equation). That is, the magnetic detection coil 1*a* detects the magnetic field which undergoes first-order differentiations respectively in three different directions. Since the magnetic detection coil 1*a* having said composition reduces the effect of environmental magnetic field three times all told, it can decrease the effect of the environmental magnetic field more efficiently than a first-order differential coil 182, as shown in FIG. 10B.

b. Magnetic Detection Coil: Embodiment 2

Figure 2:
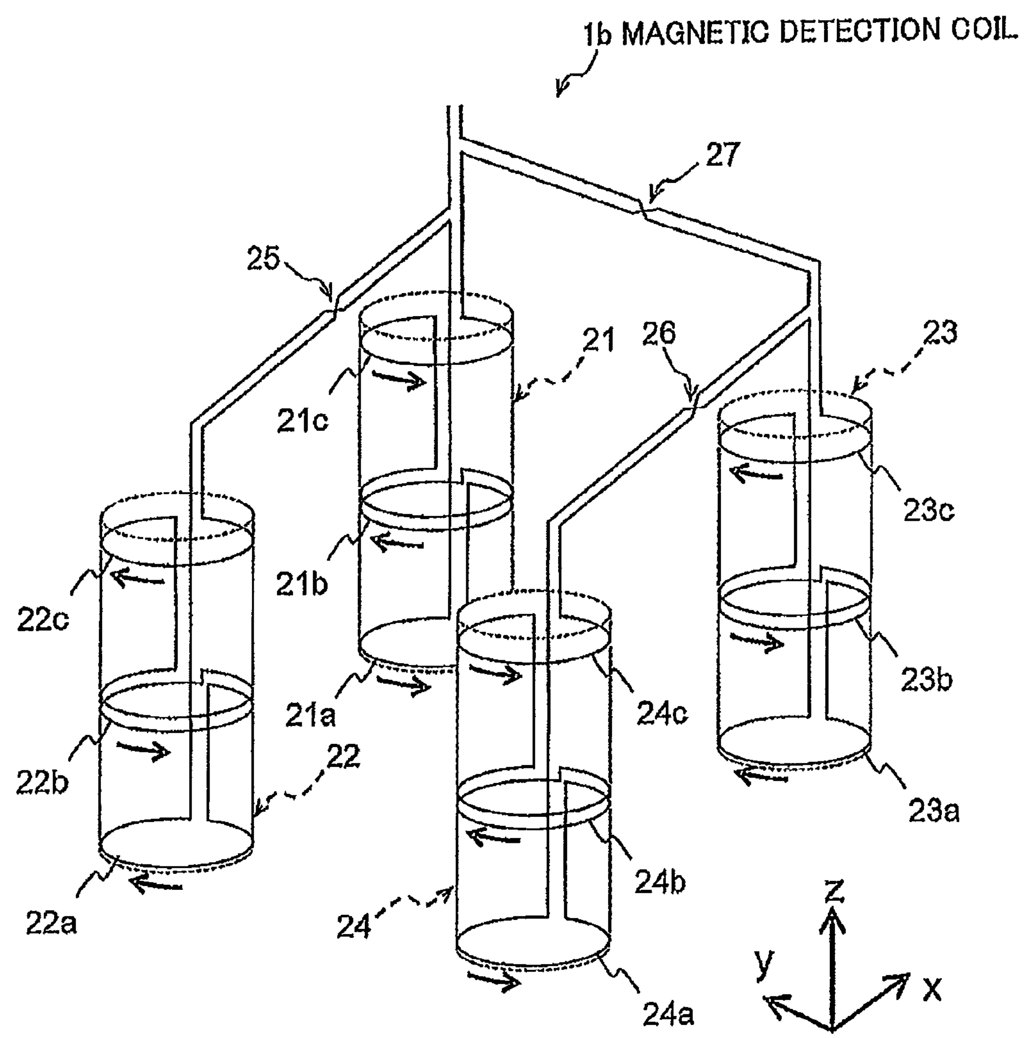
FIG. 2 is a perspective view illustrating a magnetic detection coil according to an embodiment (case 2 of the present invention).

FIG. 2 is a perspective view illustrating a magnetic detection coil according to an embodiment.

A magnetic detection coil 1*b* in the embodiment includes second-order differential coils 21, 22, 23 and 24, which are formed of a single wire.

The second-order differential coil 21 (referred to as "first differential coil") comprises a coil 21*a*, a coil 21*b*, and a coil 21*c*. The coil 21*a* is made of a superconductor wire wound one turn in the first winding direction around a bobbin. The coil 21*b* is made of a superconductor wire wound two turns in the second winding direction (which is opposite to the first winding direction) around the same bobbin, and disposed a predetermined distance in the positive direction of the z-axis apart from the coil 21*a*. The coil 21*c* is made of a superconductor wire wound one turn in the first winding direction around the same bobbin, and disposed a predetermined distance in the positive direction of the z-axis apart from the coil 21*b*. By arranging said coils 21*a*, coil 21*b* and coil 21*c* to have the above mentioned arrangement, an addition of a value of magnetic flux detected by the coil 21*a* and a value of magnetic flux detected by the coil 21*c* is subtracted by a value equal to double a value of magnetic flux detected by the coil 21*b* (defined as "difference in the first direction").

The second-order differential coil 22 (referred to as "second differential coil") is disposed adjacent to the second-order differential coil 21, and comprises a coil 22*a*, a coil 22*b*, and a coil 22*c*. The coil 22*a* is made of a superconductor wire wound one turn in the second winding direction around a bobbin which is disposed a predetermined distance in the negative direction of the x-axis apart from the coil 21*a*. The coil 22*b* is made of a superconductor wire wound two turns in the first winding direction around the same bobbin, and disposed a predetermined distance in the positive direction of the z-axis apart from the coil 22*a*. The coil 22*c* is made of a superconductor wire wound one turn in the second winding direction around the same bobbin, and disposed a predetermined distance in the positive direction of the z-axis apart from the coil 22*b*.

The second-order differential coil 23 (referred to as "third differential coil") is disposed adjacent to the second-order differential coil 21, and comprises a coil 23*a*, a coil 23*b*, and a coil 23*c*. The coil 23*a* is made of a superconductor wire wound one turn in the second winding direction around a bobbin which is disposed a predetermined distance in the negative direction of the y-axis apart from the coil 21$a$. The coil 23$b$ is made of a superconductor wire wound two turns in the first winding direction around the same bobbin, and disposed a predetermined distance in the positive direction of the z-axis apart from the coil 23$a$. The coil 23$c$ is made of a superconductor wire wound one turn in the second winding direction around the same bobbin, and disposed a predetermined distance in the positive direction of the z-axis apart from the coil 23$b$.

The second-order differential coil 24 (referred to as "fourth differential coil") is disposed adjacent to the second-order differential coil 23, and comprises a coil 24$a$, a coil 24$b$, and a coil 24$c$. The coil 24$a$ is made of a superconductor wire wound one turn in the first winding direction around a bobbin which is disposed a predetermined distance in the negative direction of the x-axis apart from the coil 23$a$. The coil 24$b$ is made of a superconductor wire wound two turns in the second winding direction around the same bobbin, and disposed a predetermined distance in the positive direction along the z-axis apart from the coil 24$a$. The coil 24$c$ is made of a superconductor wire wound one turn in the first winding direction around the same bobbin, and disposed a predetermined distance in the positive direction of the z-axis apart from the coil 24$b$.

According to a similar method to that employed for the second-order differential coil 21, differences in the first direction of magnetic flux detected by second-order differential coils 22, 23 and 24 are respectively provided.

By crossing the single wire at an intersection 25 between the second-order coils 21 and 22, a magnetic flux difference is taken between the second-order coil 22 and the second-order coil 21 (referred to as "difference in the second direction"). Similarly, by crossing the single wire at an intersection 26 between the second-order coils 23 and 24, a magnetic flux difference is measured between the second-order coil 24 and the second-order coil 23 (referred to as "difference in the second direction").

Furthermore, by crossing the single wire at an intersection 27, a difference is taken between the difference in the winding direction between the second-order differential coil 23 and the second-order differential coil 24 and the difference in the second direction between the second-order differential coil 22 and the second-order differential coil 21 (defined as "difference in the third direction").

The magnetic detection coil 1$b$ is formed of a single wire material, as already described above. In addition, all of coil 21$a$, coil 22$a$, coil 23$a$, and coil 24$a$ are disposed on a plane. All of coil 21$b$, coil 22$b$, coil 23$b$, and coil 24$b$ are disposed on a plane. All of coil 21$c$, coil 22$c$, coil 23$c$, and coil 24$c$ are disposed on the other plane. In other words, the respective pairs of four second-order differential coils are disposed in parallel with one another and spaced a predetermined distance apart from one another.

With the above-mentioned composition, magnetic flux $\Phi_{P2}$ detected by the magnetic detection coil 1$b$ can be given by the following equation (5):

$$\Phi_{P2}=[(\Phi_{21a}-2\Phi_{21b}+\Phi_{21c})-(\Phi_{22a}-2\Phi_{22b}+\Phi_{22c})]-[(\Phi_{23a}-2\Phi_{23b}+\Phi_{23c})-(\Phi_{24a}-2\Phi_{24b}+\Phi_{24c})] \quad (5)$$

where $\Phi_{21a}$, $\Phi_{21b}$, and $\Phi_{21c}$ are magnetic flux penetrating the coils 21$a$, 21$b$, and 21$c$, respectively; $\Phi_{22a}$, $\Phi_{22b}$, and $\Phi_{22c}$ are magnetic flux penetrating the coils 22$a$, 22$b$, and 22$c$, respectively; $\Phi_{23a}$, $\Phi_{23b}$, and $\Phi_{23x}$ are magnetic flux penetrating the coils 23$a$, 23$b$, and 23$c$, respectively; $\Phi_{24a}$, $\Phi_{24b}$, $\Phi_{24c}$ are magnetic flux penetrating the coils 24$a$, 24$b$, and 24$c$, respectively.

Figure 10C:
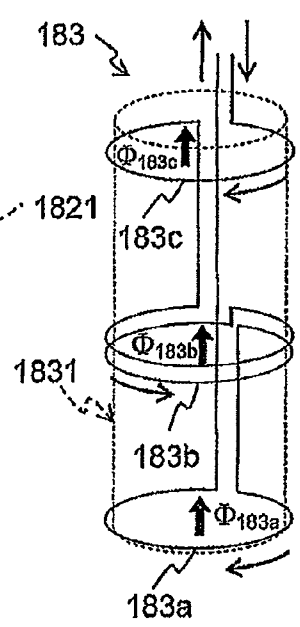
FIG. 10C is a second-order differential coil.
Figure 10D:
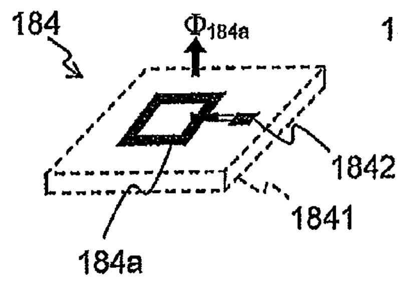
FIG. 10D is a zeroth-order differential coil formed on a thin film substrate.
Figure 10E:
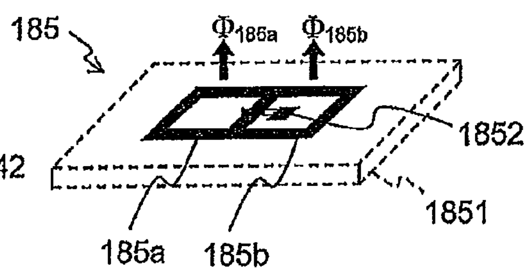
FIG. 10E is a first-order differential coil formed on a thin film substrate.

As described above, the magnetic detection coil 1$b$ according to this embodiment is a magnetic detection coil which second-order differentiates the respective magnetic field in the z-axis direction ("difference in the first direction" given by a polynomial expression in the respective parentheses in the above equation); the respective magnetic field is then first-order differentiated in the x-axis direction ("difference in the second direction" given by a polynomial expression in the respective square brackets in the above equation); the respective magnetic field is finally first-order differentiated in the y-axis direction ("difference in the third direction" given by the entire expression of the above equation). That is, the magnetic detection coil 1$b$ detects magnetic field which undergoes first-order or second-order differentiations respectively in three different directions. With said arrangement, the magnetic detection coil 1$b$ can reduce the effect of the environmental magnetic field more efficiently than the second-order differential coil 183, as shown in FIG. 10C.

It should be noted that only a cylindrical shape is quoted as the geometry of the magnetic detection coils 1$a$ and 1$b$ in FIGS. 1 and 2, but not limited to these examples, coils, for instance, having a polygonal shape may be used. Also note that the magnetic detection coils 1$a$ and 1$b$ in FIGS. 1 and 2 are arranged so that three different directions in which magnetic fields are differentiated are mutually orthogonal; but not limited to these examples, said three different directions for differentiation may not be mutually orthogonal; note, however, that a geometric figure created by connecting the centers of the respective coils must form a parallelogram. Accordingly, for example, not all of the coil 21$a$, the coil 22$a$, the coil 23$a$, and the coil 24$a$, as shown in FIG. 2, may be located on the same plane. Similarly, the other coils do not necessarily co-exist on the same plane.

c. Simulation Results

The following description is given of advantages in terms of signal strength of a magnetic signal (hereinafter referred to as "signal strength") detected by the magnetic detection coil 1 according to said embodiments, with reference to FIGS. 3 to 4.

A typical current dipole in a cardiac muscle of a fetus at thirty-weeks' gestation is assumed as the magnetic signal source in the following simulation. (See A. Kandori, T. Miyashita, and K. Tsukada, "A vector fetal magnetocardiogram system with high sensitivity" Review of Scientific Instruments USA, December 1999, Volume 70, P. 4702).

Assuming that currents concentrate at one point $r_0=(0, 0, -z_0)$, a current dipole Q is defined by the following equation (6), using J(r) as current density at r=(x, y, z) (See "Basic mathematical and electromagnetic concepts of the biomagnetic inverse problem" J. Sarvas, Physics in Medicine and Biology, January 1987, Volume 32 P. 11):

$$J(r)=\delta(r-r_0)\cdot Q \quad (6)$$

where $\delta(r-r_0)$ represents the delta function.

Therefore, magnetic field B(r) generated by the current dipole Q is expressed by the following equation (7):

$$B(r)=(\mu_0/4\pi)Q\times(r-r_0)/|r-r_0|^3 \quad (7)$$

Hereinafter, values in the above-mentioned equation are set as follows: a current dipole Q in a cardiac muscle of a fetus=(250 cos θ, 250 sin θ, 0) (nA·m), $z_0$ as a distance from a magnetic detection coil to a current dipole Q is set equal to 49 (mm), and a distance between neighboring coils in the z-axis direction is set equal to 50 (mm). $\mu_0=4\pi/10^7$ is the magnetic permeability of free space.

Figure 11:
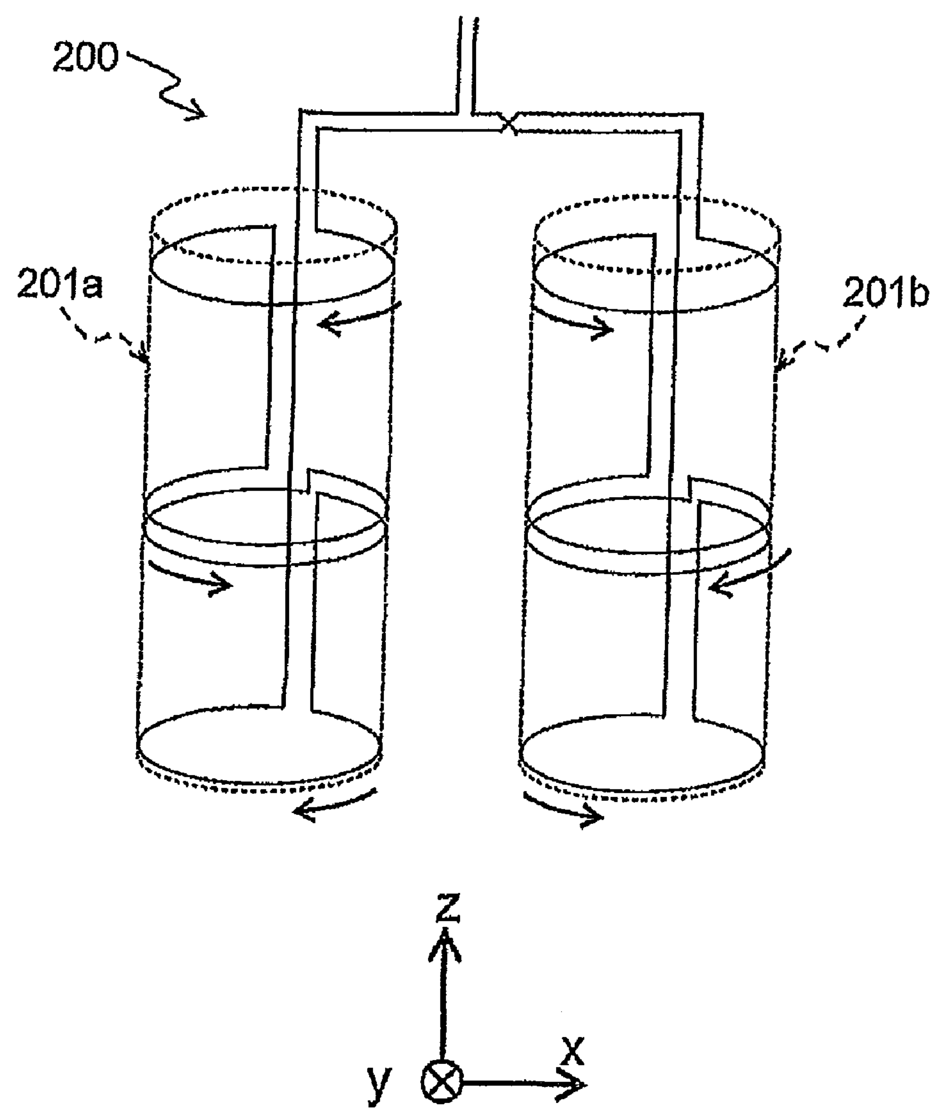
FIG. 11 is a perspective view illustrating a magnetic detection coil related to Japanese laid-open patent application 2007-108083.

The following description is given of signal strength detected respectively by the coil 1$b$, the coil 183, and the coil 200, while referring to FIGS. 3A to 3C and FIGS. 4A to 4C, along with FIG. 10C, FIG. 11 and FIG. 2.

Figure 3A:
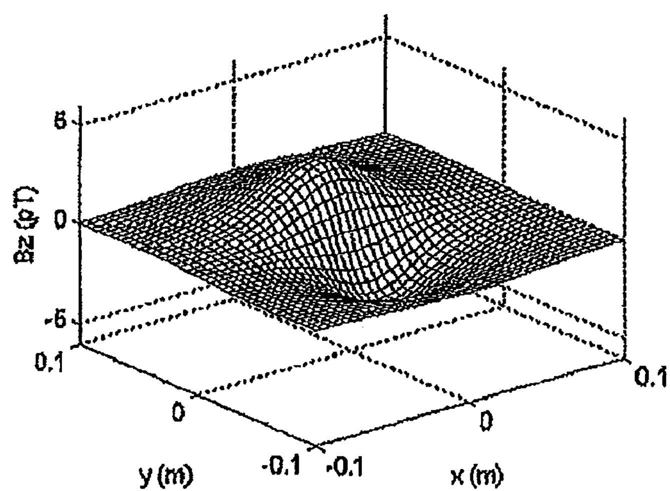
FIG. 3A shows a simulation result obtained by using the second-order differential coil as shown in FIG. 10C.
Figure 3B:
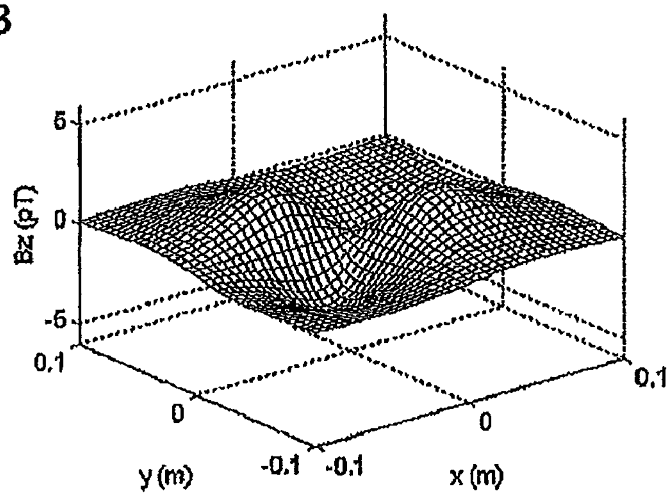
FIG. 3B shows a simulation result obtained by using the magnetic detection coil as shown in FIG. 11.
Figure 3C:
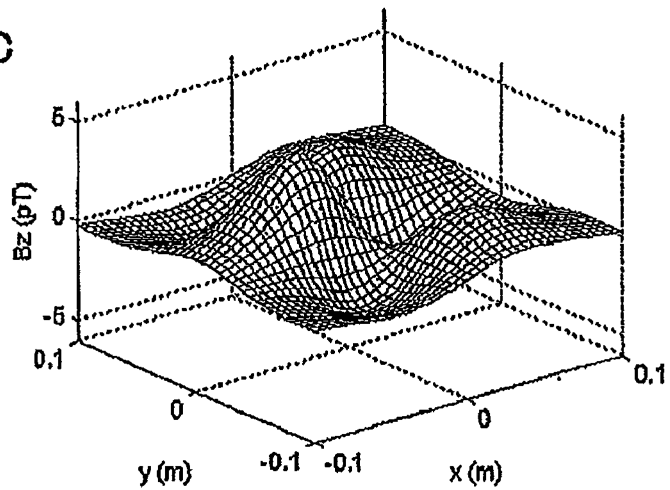
FIG. 3C shows a simulation result obtained by using magnetic detection coil as shown in FIG. 2.

FIG. 3 are graphs illustrating distributions of signal strength detected respectively by the coil 1*b*, the coil 183, and the coil 200 in the case of θ=0, in other words, when a current dipole Q exists at (250, 0, 0) (nA·m). FIG. 3A is a simulation result when using the second-order differential coil as shown in FIG. 10C; FIG. 3B is a simulation result when using the magnetic detection coil as shown in FIG. 11; FIG. 3C is a simulation result when using the magnetic detection coil as shown in FIG. 2, respectively.

FIG. 3A is a distribution of signal strength detected by the second-order differential coil 183 as shown in FIG. 1C. As for FIG. 3A, the center of the coil 183*a* in the second-order differential coil 183 is assumed to have the coordinates (x, y, 0) (m) on the graph. According to this simulation, an absolute value of signal strength reaches a maximum of 2.8 pT at (x, y)=(0, ±30) (mm).

FIG. 3B is a distribution of signal strength detected by the magnetic detection coil 200 as shown in FIG. 11. As for FIG. 3B, the midpoint between the center $P_{201a}$ of the coil 201*a* and the center $P_{202a}$ of the coil 202*a* in the magnetic detection coil 200 is assumed to have the coordinates (x, y, 0) (m) on the graph. According to this simulation, an absolute value of signal strength reaches a maximum of 2.3 pT at (x, y)=(−35, ±30) (mm).

FIG. 3C is a distribution of signal strength detected by the magnetic detection coil 1*b* as shown in FIG. 2. Let the centers of the coil 21*a*, the coil 22*a*, the coil 23*a* and the coil 24*a* in the magnetic detection coil 1*b* be $P_{21a}$, $P_{22a}$, $P_{23a}$ and $P_{24a}$, respectively. In FIG. 3C, the centroid of $P_{21a}$, $P_{22a}$, $P_{23a}$, and $P_{24a}$ is assumed to have the coordinates (x, y, 0) (m) on the graph. According to this simulation, an absolute value of signal strength reaches a maximum of 4.5 pT at (x, y)=(±35, 0) (mm). Therefore, in the case of θ=0 (degree), it is understood that the magnetic detection coil 1*b* as shown in FIG. 2 can detect the largest signal strength among said three types of magnetic detection coils 1*b*, 183, and 200.

Note that "r", "$r_0$", "J(r)", "B(r)", and "Q" respectively represent their vectors.

Figure 4:
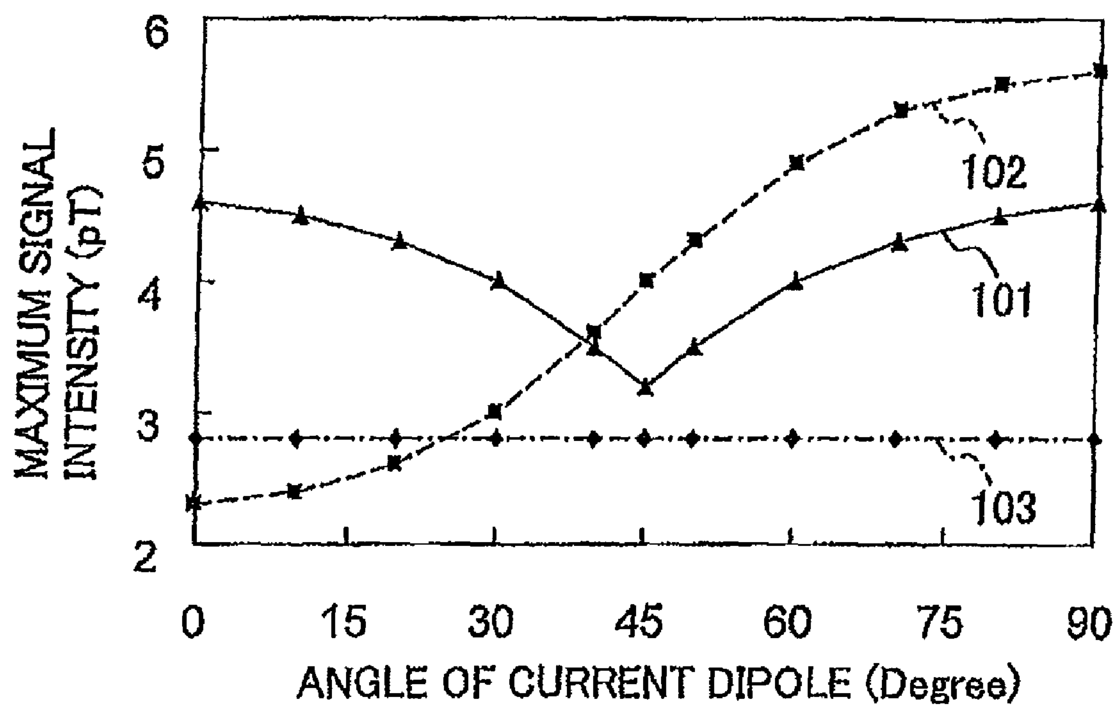
FIG. 4 shows a relationship between an angle $\theta$ of a current dipole and maximum values of the absolute value of signal intensity detected respectively by said magnetic detection coils.

FIG. 4 indicates a relationship between an angle θ of a current dipole and a maximum absolute value of signal strength detected respectively by said magnetic detection coils. In FIG. 4, curve 103, curve 102, and curve 101 respectively represent maximum absolute values of signal strength detected by said magnetic detection coils: curve 103 corresponds to an instance using the second-order differential coil 183 as shown in FIG. 10C; curve 102 corresponds to an instance using the magnetic detection coil 200 as shown in FIG. 11. The curve 101 corresponds to an instance using the magnetic detection coil 1*b* as shown in FIG. 2. The maximum absolute value of signal strength detected by the second-order differential coil 183 as shown in FIG. 10C is kept constant at 2.8 pT, regardless of angle θ of a current dipole. The maximum absolute value of signal strength detected by the magnetic detection coil 200 as shown in FIG. 11 has a minimum of 2.3 pT at θ=0, or a maximum of 5.6 pT at θ=90. The maximum absolute value of signal strength detected by the magnetic detection coil 1*b* as shown in FIG. 2 has a minimum of 3.2 pT at θ=45, or a maximum of 4.5 pT at θ=0 or 90.

According to the results described above, it is understood that, among said curves 101 to 103, curve 101 having the largest minimum value can yield stable signal strength, regardless of angle θ of a current dipole. In other words, it is understood that the magnetic detection coil 1*b* as shown in FIG. 2 is the most preferable from the viewpoint of retaining stable signal strength. Thus, the magnetic detection coil 1*b* as shown in FIG. 2 is able to detect stable signal strength despite the direction of a current from the signal source.

Furthermore, equation (5) gives an expectation of greater reduction in the effects of environmental magnetic fields when using the magnetic detection coil 1*b* as shown in FIG. 2, compared with the second-order differential coil 183 as shown in FIG. 10C, or the magnetic detection coil 200 as shown in FIG. 11. This can lead to the conclusion that a higher S/N ratio can be obtained when using the magnetic detection coil 1*b*, compared with the second-order differential coil 183, or the magnetic detection coil 200. Because of equation (4), the same is applied to the magnetic detection coil 1*a* as shown in FIG. 1.

d. Magnetic Detection Coil: Embodiment 3

Figure 5:
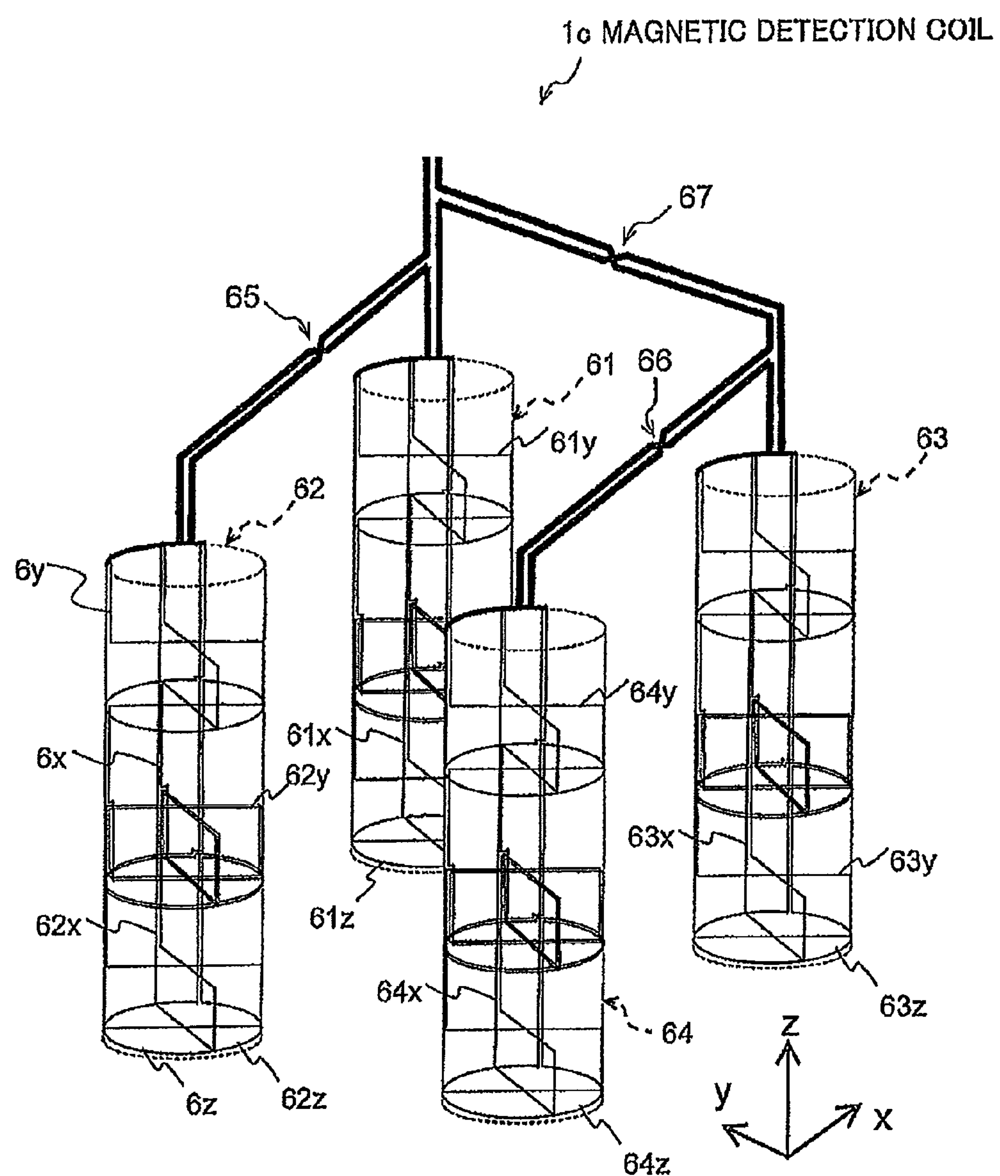
FIG. 5 is a perspective view illustrating a magnetic detection coil according to an embodiment of the present invention.

FIG. 5 is a perspective view illustrating a magnetic detection coil according to an embodiment.

A magnetic detection coil 1*c* in the embodiment provides a set of magnetic detection coil groups which can detect magnetic field gradients in the respective three directions, which are generated by current components in the respective directions of the x-axis, the y-axis and the z-axis.

A magnetic detection coil 1*c* comprises magnetic detection coil groups 61 to 64.

A coil group 61 is constituted by a second-order differential coil 61*z*, a second-order differential coil 61*x*, and a second-order differential coil 61*y*. The second-order differential coil 61*z* has a composition similar to each of the second-order differential coils 21 to 24 as shown in FIG. 2. The second-order differential coil 61*x* has the loop planes which are orthogonal to the respective loop planes in the second-order differential coil 61*z*. The second-order differential coil 61*y* has the loop planes which are orthogonal to the respective loop planes in both the second-order differential coils 61*z* and 61*x*. There are three coils constituting each of the second differential coils 61*x*, 61*y* and 61*z*, a downmost coil disposed at the lowest in the z-axis direction, an uppermost coil disposed at the highest in the z-axis direction and a middle coil disposed between the downmost coil and the uppermost coil. In each of the second-order differential coils 61*z* and 61*x*, each of the downmost coil and the uppermost coil has one turn loop, while the middle coil has 2 turn loops. Although, in said embodiment, the respective loop planes in the second-order differential coils 61*x*, 61*y* and 61*z* are indicated to be orthogonal to one another; but these loop planes may not necessarily orthogonal to one another if the directions of these loop planes are not identical.

Similarly to the composition of the coil group 61, a coil group 62 comprises a second-order differential coil 62*z*, a second-order differential coil 62*x*, and a second-order differential coil 62*y*. The second-order differential coil 62*z* has an composition similar to each of the second-order differential coils 21 to 24 as shown in FIG. 2. The second-order differential coil 62*x* has the loop planes which are orthogonal to the respective loop planes of the second-order differential coil 62*z*. The second-order differential coil 62*y* has the loop planes which are orthogonal to the respective loop planes in both the second-order differential coils 62*z* and 62*x*.

A coil group 63 comprises a second-order differential coil 63*z*, a second-order differential coil 63*x*, and a second-order differential coil 63*y*. The second-order differential coil 63*z* has a composition similar to each of the second-order differential coils 21 to 24 as shown in FIG. 2. The second-order differential coil 63*x* has the loop planes which are orthogonal to the respective loop planes in the second-order differential coil 63*z*. The second-order differential coil 63*y* has the loop planes which are orthogonal to the respective loop planes in both the second-order differential coils 63*z* and 63*x*.

A coil group 64 comprises a second-order differential coil 64*z*, a second-order differential coil 64*x*, and a second-order differential coil 64*y*. The second-order differential coil 64*z* has a composition similar to each of the second-order differential coils 21 to 24 as shown in FIG. 2. The second-order differential coil 64*x* has the loop planes which are orthogonal to the respective loop planes in the second-order differential coil 64*z*. The second-order differential coil 64*y* has the loop planes which are orthogonal to the respective loop planes in both the second-order differential coils 64*z* and 64*x*.

The second-order differential coils 61*x* to 64*x* are formed of a single wire made of a material such as a superconductor material. Similarly, the second-order differential coils 61*y* to 64*y* as well as the second-order differential coils 61*z* to 64*z* are formed of a single wire made of a material such as a superconductor material. It should be noted that the second-order differential coils 61*x* to 64*x*, the second-order differential coils 61*y* to 64*y*, and the second-order differential coils 61*z* to 64*z* are made of different wires. Namely, the second-order differential coils 61*x* to 64*x*, the second-order differential coils 61*y* to 64*y*, and the second-order differential coils 61*z* to 64*z* respectively constitute separate magnetic detection coils 6*x*, 6*y* and 6*z*, which are independent of one another. The magnetic detection coils 6*x*, 6*y* and 6*z* are bundled together above each of the coil groups 61 to 64 in the z-axis direction (indicated by thick lines in FIG. 5). The bundled single wires are crossed at intersections 65 and 66 so as to provide differences in the second direction respectively the same way as described in FIG. 2. The bundled single wires are again crossed at an intersection 67 to provide a difference in the third direction the same way as described in FIG. 2.

With the composition described above, the magnetic detection coil according to an embodiment is capable of detecting a magnetic field having components in the respective directions (or in different directions) in terms of the x-, y- and z-axis. Since a magnetic signal typically has not only a z-component but also x- and y-components, signal intensity can be increased by synthesizing the respective components in said directions. Therefore, the embodiment can be expected to yield a higher S/N ratio than that of the magnetic detection coil 1*b* as shown in FIG. 2, which can only detect a magnetic field of the z-axis component.

It should be noted that, in the embodiment described above, each of the coils constituting a magnetic detection coil 1*c* is a second-order differential coil; but not limited to the arrangement, a first-order differential coil may also be used.

e. Example for Application of Magnetic Detection Coils: Apparatus for Magnetocardiography With reference to FIG. 6 along with FIGS. 1, 2 and 5, the following description is given of an apparatus 1000 for biomagnetic field measurement (an apparatus for magnetic field measurement) which employs a magnetic detection coil 1 according to an embodiment.

Figure 6:
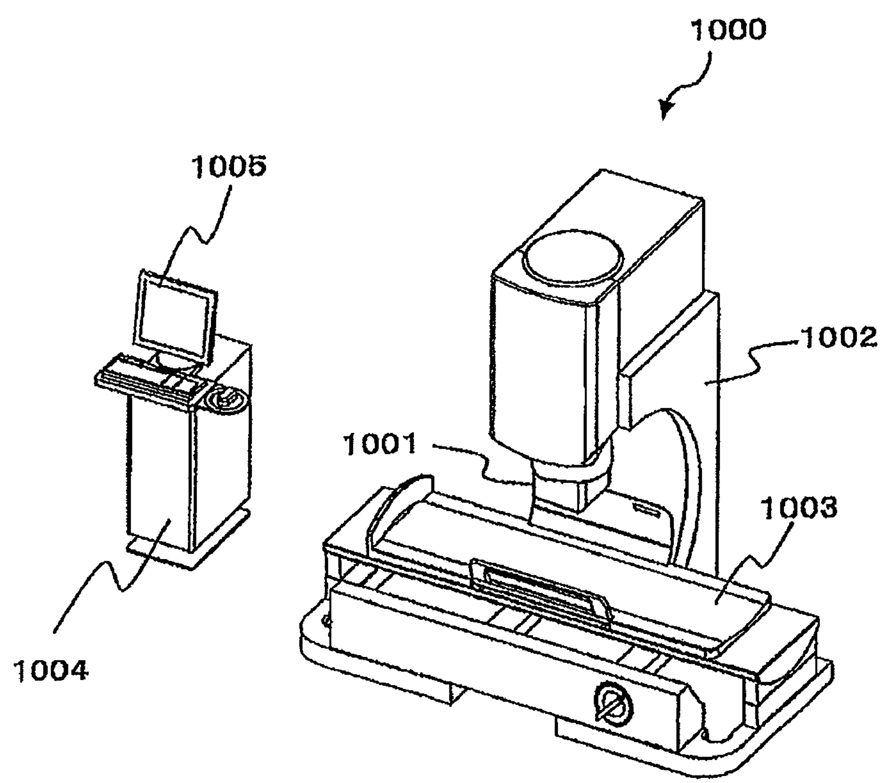
FIG. 6 is a perspective view illustrating an entire composition of an apparatus for a biomagnetic field measurement according to an embodiment of the present invention (embodiment 3 of the present invention).

FIG. 6 is a perspective view illustrating an entire arrangement of said apparatus for biomagnetic field measurement according to the embodiment.

In the apparatus 1000 for biomagnetic field measurement, a magnetic detection coil 1*a* as shown in FIG. 1, a magnetic detection coil 1*b* as shown in FIG. 2, or a magnetic detection coil 1*c* as shown in FIG. 5, as well as a SQUID are kept at low temperature within a cryostat 1001. It should be noted that a bottom plane of the cryostat 1001 is perpendicular to the z-axis. Liquid helium is charged in the cryostat 1001, which is thermally insulated from the exterior by a vacuum insulation layer. The cryostat 1001 is supported by a gantry 1002. An examinee of biomagnetic field measurement lies on a bed 1003, and the height and the horizontal positions of the bed 1003 are adjusted so that a body part to be measured (the chest or back in the case of magnetocardiography, for example) is disposed close to the bottom plane of the cryostat 1001. A measurement and control circuit 1004 controls a SQUID magnetometer to convert detected magnetic signals into voltage signals, which are then transmitted to a signal processing and displaying device 1005. The device 1005 is able to eliminate the effects of environmental magnetic fields using DSP so that magnetic signals from a living organism of an examinee can be detected to display information, including waveforms of magnetocardiography or magnetoencephalography, magnetic isofield maps, and current distribution maps, in real time.

f. Example for Application of Magnetic Detection Coils: Apparatus for Fetal Magnetocardiography With reference to FIG. 7 along with FIGS. 1, 2 and 5, the following description is given of an apparatus 1100 for fetal magnetocardiography, which is one type of an apparatus for magnetic field measurement using a magnetic detection coil 1 according to an embodiment.

Figure 7:
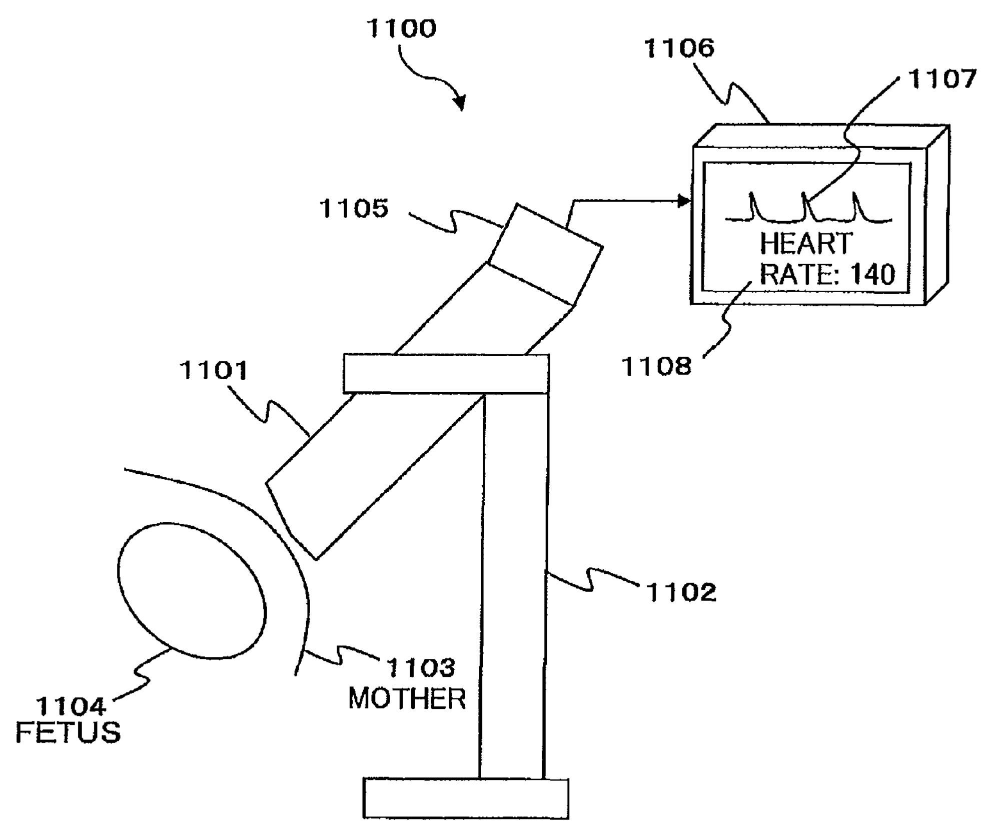
FIG. 7 is a perspective view illustrating an apparatus for magnetocardiography of a fetus according to an embodiment.

FIG. 7 is a perspective view illustrating a fetal magnetocardiography apparatus according to the embodiment.

In the apparatus 1100 for fetal magnetocardiography, one of a magnetic detection coil 1*a* as shown in FIG. 1, a magnetic detection coil 1*b* as shown in FIG. 2, and a magnetic detection coil 1*c* as shown in FIG. 5, as well as a SQUID are kept at low temperature within a cryostat 1101. It should be noted that the bottom plane of the cryostat 1101 is perpendicular to the z-axis. Liquid helium is charged in the cryostat 1101, which is thermally insulated from the exterior by a vacuum insulation layer. The cryostat 1101 is supported by a gantry 1102. Note, however, that the cryostat 1101 is not only movable in horizontal and vertical directions, but also adjustable with respect to a gradient of itself. A position of the cryostat 1101 is so adjusted that a magnetic detection coil 1 is positioned near the abdomen of a mother 1103 of a fetus to be monitored. A measurement and control circuit 1105 controls a SQUID magnetometer to convert detected magnetic signals into voltage signals, which are then transmitted to a signal processing and displaying device 1106. The device 1106 is able to eliminate the effects of environmental magnetic fields as well as magnetocardiographic signals generated by the mother 1103 using DSP so that the magnetocardiographic signals from the fetus 1104 can be detected to display a magnetocardiographic waveform 1107 of the fetus 1104 in real time. The device 1106 can also display a fetal heart rate 1108 from calculation using said magnetocardiographic signals of the fetus 1104 in real time. Therefore, said fetal magnetocardiography apparatus 1100 is capable of performing real-time monitoring on the magnetocardiographic waveform 1107 and the heart rate 1108 of the fetus 1104.

g. Example for Application of Magnetic Detection Coils: Apparatus for Magnetoencephalography With reference to FIG. 8 along with FIGS. 1, 2 and 3, the following description is given of a magnetoencephalography apparatus 1200 using a magnetic detection coil 1 according to an embodiment.

Figure 8:
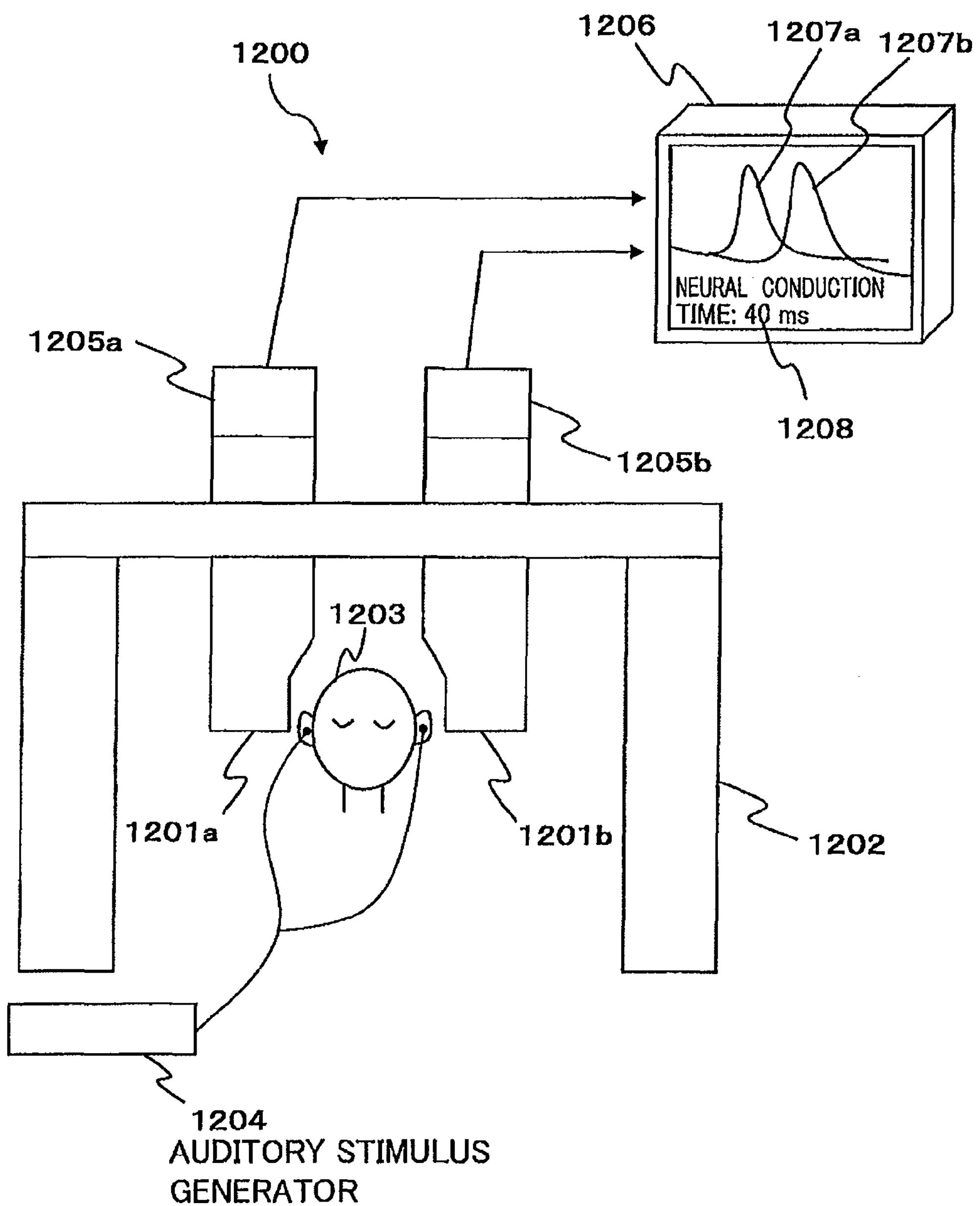
FIG. 8 is a perspective view illustrating an apparatus for magnetoencephalography according to an embodiment.
Figure 9:
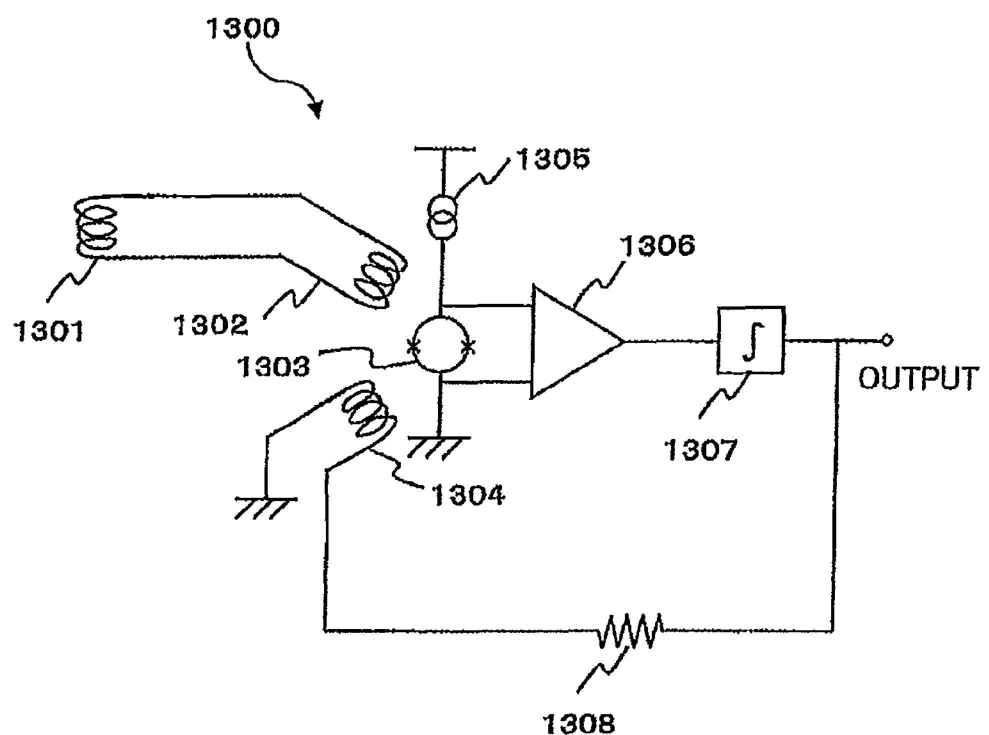
FIG. 9 is a schematic diagram illustrating an arrangement of a Flux Locked Loop (FLL) circuit in a typical apparatus for magnetic field measurement.

FIG. 8 is a perspective view illustrating a magnetoencephalography apparatus 1200, which is one type of an apparatus for magnetic field measurement according to the embodiment.

In the magnetoencephalography apparatus 1200, one of a magnetic detection coil 1*a* as shown in FIG. 1, a magnetic detection coil 1*b* as shown in FIG. 2, and a magnetic detection coil 1*c* as shown in FIG. 5, as well as SQUIDs are kept at low temperature within cryostats 1201*a* and 1201*b*. It should be noted that the respective lateral sides of the cryostats 1201*a* and 1201*b* are perpendicular to the z-axis. Liquid helium is charged in the cryostats 1201*a* and 1201*b*, which are thermally insulated from the exterior by a vacuum insulation layer. The cryostats 1201*a* and 1201*b* are supported by a gantry 1202. Note, however, that the cryostats 1201*a* and 1201*b* are not only movable in horizontal and vertical directions, but also adjustable with respect to gradients of themselves.

Positions of the cryostats 1201*a* and 1201*b* are so adjusted that magnetic detection coils 1 within the cryostats 1201*a* and 1201*b* are disposed close to a body part to be measured on the head of an examinee 1203. Measurement and control circuits 1205*a* and 1205*b* control SQUID magnetometers to convert detected magnetic signals into voltage signals, which are then transmitted to a signal processing and displaying device 1206. The device 1206 eliminates the effects of environmental magnetic fields using DSP so that magnetoencephalographic signals of the examinee 1203 can be detected to display encephalomagnetic waveforms 1207*a* and 1207*b* in real time.

Said apparatus 1200 includes an auditory stimulus generator 1204, which is used for measuring a neural conduction time. The generator 1204 gives auditory stimuli to the ears of the examinee 1203 so that the signal processing and displaying device 1206 performs real-time monitoring of responses of the examinee 1203. The device 1206 is also able to calculate a time difference between peaks of magnetoencephalographic waveforms 1207*a* and 1207*b*, and to display a transmission time 1208 in real time. In addition to sensory stimulus evoked magnetic fields caused by responses to said auditory stimuli, visual stimuli and somatosensory stimuli, and the like, the apparatus 1200 is able to measure magnetic fields arising from spontaneous brain activities (spontaneous brain magnetic fields) as well as magnetic fields arising from brain activities evoked by internal and external events (event-related magnetic fields).

The above-mentioned embodiment regarding a magnetic detection coil 1 gives an example of usage for the magnetic detection coil 1 which provides a first-order or second-order differentiation in the vertical direction. It should be noted that the magnetic detection coil 1 according to the embodiment has an arrangement which makes it possible to detect signals differentiated in three different directions. Therefore, it may be possible to alternatively select a magnetic detection coil 1 which, for example, gives differentiation of three or more orders in the z-axis direction.

In the embodiment described above, a SQUID magnetometer has been selected as an example of a magnetometer which converts magnetic flux detected by the magnetic detection coil 1 into a voltage value. Alternatively, other magnetometers can include a magnetoresistance element, a giant magnetoresistance element, a fluxgate magnetometer, and an optical pumping magnetometer. In the embodiment described above, liquid helium has been selected as an example of cooling a SQUID; it may also be possible to alternatively adopt a cryogenic cooler to cool a SQUID, or liquid nitrogen if the SQUID is made of a high-temperature superconducting material.

According to the embodiments described above, stable detection of magnetic signals is possible without considering the current direction of the signal source.

The embodiments described above can provide an apparatus for biomagnetic field measurement having a higher S/N ratio, resulting in more sensitive and accurate measurement of biomagnetism. Therefore, the embodiments allow biomagnetic field measurement under an environment without preparing a magnetic shield.

It is noted that although the mode described above is the best mode for carrying out the invention, it is not intended to limit the invention to such mode. Accordingly, the mode for carrying out the invention may be variously modified within a scope in which the subject matter of the invention is not changed.

What is claimed is:

1. A magnetic detection coil, comprising:

a single wire of either a superconductor material or a metal material;

wherein the single wire comprises four differential coils which are disposed such that four respective centers of the four differential coils constitute substantially four apexes of a parallelogram, and connection lines electrically connecting said four differential coils with each other and the connection lines crossing between the four differential coils, so as to measure a difference in a magnetic flux value for magnetic flux penetrating the differential coil between a pair of the differential coils, with respect to each of three different directions.

2. A magnetic detection coil, comprising:

a single wire of either a superconductor material or a metal material, wherein the single wire comprises four differential coils which are disposed such that four respective centers of the four differential coils constitute substantially four apexes of a parallelogram, said four differential coils including a first differential coil, a second differential coil disposed adjacent to the first differential coil, a third differential coil disposed adjacent to the first differential coil and a fourth differential coil disposed adjacent to the third differential coil, first connection lines electrically connecting the first differential coil and the second differential coil with each other and the first connection lines crossing between the first differential coil and the second differential coil, so that a difference in a magnetic flux value for magnetic flux penetrating the differential coil between the first differential coil and the second differential coil is measured, second connection lines electrically connecting the third differential coil and the fourth differential coil with each other and the second connection lines crossing between the third differential coil and the fourth differential coil, so that a difference in a magnetic flux value for magnetic flux penetrating the differential coil between the third differential coil and the fourth differential coil is measured, and third connection lines electrically connecting the first differential coil and the third differential coil with each other and the third connection lines crossing between the third differential coil and the fourth differential coil, so that a difference in a magnetic flux value for magnetic flux penetrating the differential coil between the first differential coil and the third differential coil is measured.

3. The magnetic detection coil according to claim 1, wherein said parallelogram is a square.

4. The magnetic detection coil according to claim 2, wherein said parallelogram is a square.

5. The magnetic detection coil according to claim 1, wherein the respective four differential coils are first-order differential coils.

6. The magnetic detection coil according to claim 2, wherein the respective four differential coils are first-order differential coils.

7. The magnetic detection coil according to claim 1, wherein the respective four differential coils are second-order differential coils.

8. The magnetic detection coil according to claim 2, wherein the respective four differential coils are second-order differential coils.

9. A magnetic detection coil comprising three of the magnetic detection coils according to claim 1, wherein three coil disposed planes, on each of which the four differential coils of the magnetic detection coil according to claim 1 are disposed, are disposed orthogonal to one another.

10. A magnetic detection coil comprising three of the magnetic detection coils according to claim 2, wherein three coil disposed planes, on each of which the four differential coils of the magnetic detection coil according to claim 2 are disposed, are disposed orthogonal to one another.

11. A magnetic field measurement apparatus for transmitting a magnetic signal detected by a magnetic detection coil to a superconducting quantum interference device (SQUID), comprising:

the magnetic detection coil made of a single wire of either a superconductor material or a metal material, wherein the single wire comprises four differential coils which are disposed such that four respective centers of the four differential coils constitute substantially four apexes of a parallelogram, and connection lines electrically connecting said four differential coils with each other and the connection lines crossing between the four differential coils, so as to measure a difference in a magnetic flux value for magnetic flux penetrating the differential coil between a pair of the differential coils, with respect to each of three different directions.

12. The magnetic field measurement apparatus according to claim 11 for detecting a magnetic signal generated from a human heart.

13. The magnetic field measurement apparatus according to claim 12, wherein said human heart is of a fetus.

14. The magnetic field measurement apparatus according to claim 11, comprising means for detecting a magnetic signal generated from a human brain, and means for monitoring a neural conduction time.

15. The magnetic detection coil according to claim 1, wherein the four differential coils include a first differential coil, a second differential coil, a third differential coil and a fourth differential coil, and the difference in the magnetic flux value is ((magnetic flux penetrating the first differential coil)−(magnetic flux penetrating the second differential coil))−((magnetic flux penetrating the third differential coil)−(magnetic flux penetrating the fourth differential coil)).

16. The magnetic field measurement apparatus according to clam 11, wherein the four differential coils include a first differential coil, a second differential coil, a third differential coil and a fourth differential coil, and the difference in the magnetic flux value is ((magnetic flux penetrating the first differential coil)−(magnetic flux penetrating the second differential coil))−((magnetic flux penetrating the third differential coil)−(magnetic flux penetrating the fourth differential coil)).

17. The magnetic detection coil according to claim 1, wherein said connection lines serially electrically connect said four differential coils with each other.

18. The magnetic detection coil according to claim 1, wherein said first, second, and third connection lines serially electrically connect said first differential coil with said second differential coil, said third differential coil with said fourth differential coil, and said first differential coil with said third differential coil, respectively.

19. The magnetic field measurement apparatus according to claim 11, wherein said connection lines serially electrically connect said four differential coils with each other.

* * * * *